United States Patent [19] [11] 3,963,985
Geldermans [45] June 15, 1976

[54] PROBE DEVICE HAVING PROBE HEADS AND METHOD OF ADJUSTING DISTANCES BETWEEN PROBE HEADS

[75] Inventor: Pieter Geldermans, Poughkeepsie, N.Y.

[73] Assignee: International Business Machines Corporation, Armonk, N.Y.

[22] Filed: Dec. 12, 1974

[21] Appl. No.: 532,079

[52] U.S. Cl. .......................... 324/158 F; 324/72.5; 324/158 P
[51] Int. Cl.² ......................................... G01R 31/02
[58] Field of Search ............ 324/158 P, 158 F, 72.5, 324/158 R

[56] References Cited
UNITED STATES PATENTS
3,781,681  12/1973  Wagner et al. ..................... 324/72.5
FOREIGN PATENTS OR APPLICATIONS
266,873  7/1970  U.S.S.R. .......................... 324/158 P

*Primary Examiner*—R. V. Rolinec
*Assistant Examiner*—Ernest F. Karlsen
*Attorney, Agent, or Firm*—Frank C. Leach, Jr.; George O. Saile

[57] ABSTRACT

A bar formed of a material having a known coefficient of expansion has probe holders arranged thereon with each of the probe holders being at a selected distance from each of the adjacent probe holders. The distance between adjacent probe holders is selected in accordance with the design distance between adjacent chip sites on a substrate so that the probes in each probe holder will contact the pads of a particular chip site. During processing, the overall dimensions of the substrate can shrink more or less than the design shrinkage so as to shrink the distances between the adjacent chip sites from the design distances. The support bar is heated to a selected temperature at which the probe holders are spaced the design distances. If the substrate has shrunk less than the design shrinkage, then additional heating of the support bar from its selected temperature expands the support bar. If the substrate has shrunk more than the design shrinkage, then the temperature of the support bar is reduced from its selected temperature through reducing the heat applied thereto and applying a suitable coolant. Accordingly, this expansion or contraction of the support bar results in the spacing between the probe holders becoming that of the spacing between the chip sites after processing of the substrate.

19 Claims, 5 Drawing Figures

PROBE DEVICE HAVING PROBE HEADS AND METHOD OF ADJUSTING DISTANCES BETWEEN PROBE HEADS

In the processing of semiconductor substrates, the substrate can be subjected to temperatures as high as 1500° to 1600° C. When processing a multilayered ceramic substrate, for example, this relatively high temperature causes the ceramic substrate to shrink a substantial amount such as 15% to 20%, for example. Process variations produce varying shrinkage from substrate to substrate so as to cause variations of the substrate from its design size at the time that it is desired to ascertain if the chip sites have the desired electrical connections. As a result of this change in the overall dimensions of the substrate, there is a similar change in the distance between adjacent chip sites.

Accordingly, if multiple probe heads are mounted on a probe support so that they are at selected distances from each other corresponding to the design distances between the chip sites, this deviation from the design distances between the chip sites due to processing variation of the substrate can result in the probes in each of the probe heads being incapable of contacting the pads on each of the chip sites because of the variation of the chip sites from the design distances. Because of this variation in dimensions of the substrate and the spacing between the chip sites, it has previously been suggested to form each of the pads with a sufficiently large area to compensate for this expansion or shrinkage of the substrate so that the probe can engage the pad.

However, this increase in the area of each of the pads beyond that required for engagement by a probe has resulted in an increased area for a chip site to thereby reduce the number of chip sites on a substrate of a fixed size or to reduce the availability of areas of the substrate for other purposes. The enlarged areas of the pads also increase the possibility of electrical shorts because of the closeness of the pads to each other.

The present invention satisfactorily solves the foregoing problems through providing a probe device in which the spacing between the probe heads is adjusted in accordance with the variation in the overall size of the substrate after processing from the design size and before the probes engage the pads. This enables the probes of each of the probe heads to be able to contact the pads on the chip sites without any requirement of the area of each of the pads being enlarged.

The present invention accomplishes the foregoing through mounting the probe heads on a support element of a material having a known coefficient of expansion and of good thermal conductivity. The support element is maintained at a selected or predetermined temperature greater than room temperature so that the spacing between the probe heads at this selected or predetermined temperature is the same as the design spacing between the chip sites.

At the completion of the processing occurring before testing, at least one of the overall dimensions of the substrate is obtained. This overall dimension is compared to the design dimension to determine whether the overall dimension of the substrate during processing has shrunk more or less than the design shrinkage. Since this change in the overall dimension from the design dimension produces the same percent of change in the spacing between adjacent chip sites from their design spacing, this variation in the overall length or width dimension of the substrate from its design dimension is ascertained. Then, the temperature of the support element is changed in accordance with this variation to expand or shrink the support element in the direction in which the probe heads are mounted on the support element to compensate for the change in the overall length or width dimension of the substrate.

Thus, if the substrate shrank too little during processing, then the temperature of the support element would be raised to increase the spacing between the probe heads the same amount as the spacing between the chip sites has increased. Similarly, if the substrate shrank too much during processing, then the temperature of the support element would be decreased to cause its length to reduce whereby the distances between the probe heads would be decreased so that they would align with the chip sites on the substrate.

An object of this invention is to provide an arrangement for changing the spacing of probe heads on a probe device.

Another object of this invention is to provide a probe device capable of having the distance between probe heads thereon changed in accordance with the change in spacing between the chip sites with which the probe heads on the probe device cooperate.

A further object of this invention is to provide a method for changing the distances between probe heads on a probe device.

The foregoing and other objects, features, and advantages of the invention will be apparent from the following more particular description of a preferred embodiment of the invention, as illustrated in the accompanying drawing.

Figure 1:
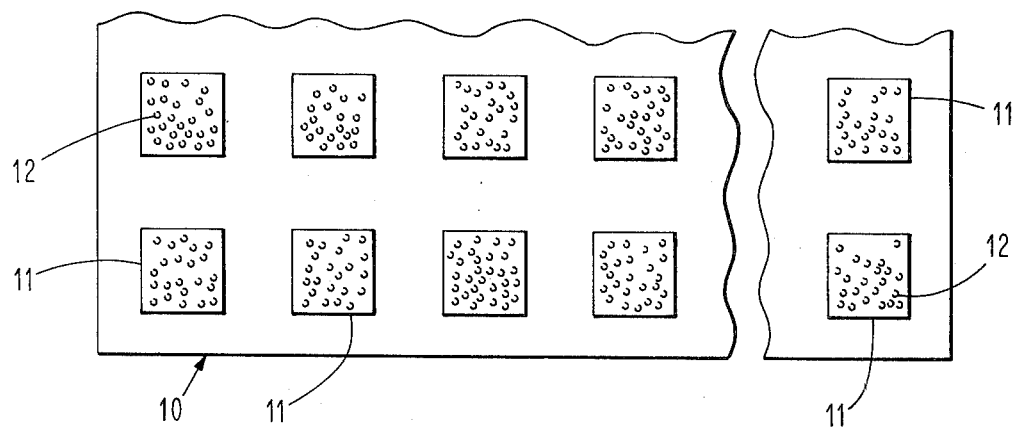
FIG. 1 is a fragmentary schematic plan view of a substrate having a plurality of chip sites thereon.

Referring to the drawing and particularly FIG. 1, there is shown a substrate 10, which could be a multilayered ceramic substrate with aluminum oxide as the ceramic, for example, having a plurality of chip sites 11 disposed thereon. Each of the chip sites 11 has a plurality of pads 12 thereon.

The chip sites 11 are preferably spaced the same distances from each other although such is not a requirement for satisfactory operation of the present invention. While only two rows of the chip sites 11 are shown, it should be understood that the substrate 10 can have any number of the rows of the chip sites 11.

Figure 2:
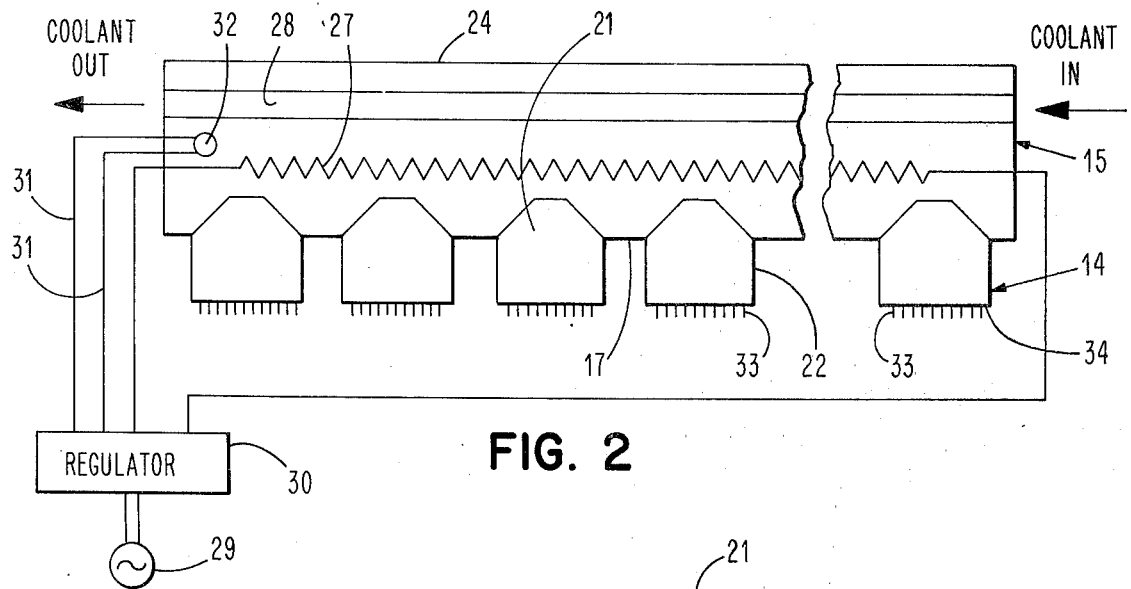
FIG. 2 is a schematic elevational view showing the probe heads mounted on a bar having its length controlled in accordance with the desired spacing between the probe heads.
Figure 3:
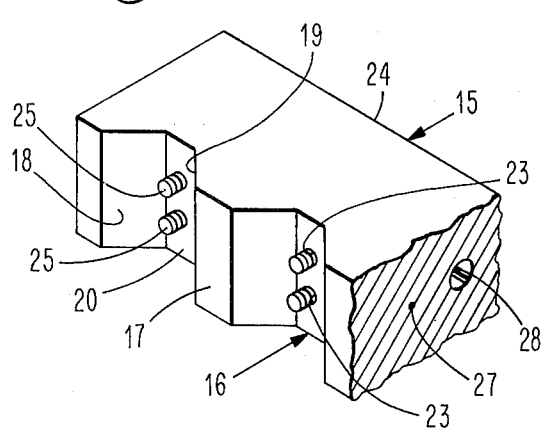
FIG. 3 is a fragmentary perspective view of a portion of the bar on which the probe heads are mounted.

A plurality of probe holders 14 (see FIGS. 2, 4, and 5) is supported on a longitudinal support bar 15 (see FIGS. 2 and 3). The bar 15 has a plurality of V-shaped grooves 16 formed in a surface 17 thereof. Each of the V-shaped grooves 16 includes a pair of inclined walls 18 and 19 and a bottom wall 20 substantially parallel to the surface 17.

Figure 4:
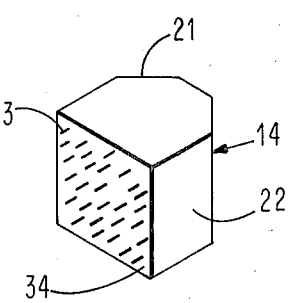
FIGS. 4 and 5 are perspective views of one of the probe holders of the present invention.
Figure 5:
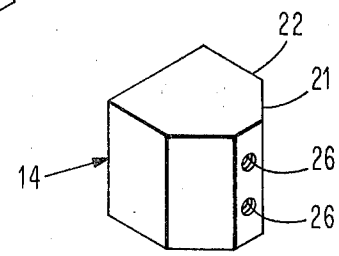

As shown in FIGS. 4 and 5, the probe holder 14 is formed with a V-shaped portion 21 of the same shape as the V-shaped groove 16 in the bar 15 so that the portion 21 fits within the groove 16. The probe holder 14 also includes a rectangular shaped portion 22 extending from the V-shaped portion 21. The rectangular shaped portion 22 extends beyond the surface or wall 17 of the bar 15 as shown in FIG. 2.

The bar 15 has holes (see FIG. 3) extending from the bottom wall 20 of the V-shaped groove 16 through the body of the bar 15 to its wall or surface 24, which is substantially parallel to the walls 17 and 20. Screws 25 extend through the holes 23, which are substantially perpendicular to the walls 20 and 24, and into threaded holes 26 (see FIG. 5) in the V-shaped portion 21 of the probe holder 14. Thus, each of the probe holders 14 is mounted at a fixed location on the bar 15 so that the distance between each pair of the adjacent probe holders 14 is at a fixed, predetermined distance for a specific temperature of the bar 15 with the temperature being greater than room temperature.

The bar 15 is formed of a suitable material having good thermal conductivity and a known coefficient of expansion. The material could be bronze or brass, for example. A heating element 27 (see FIG. 2) is disposed in the bar 15 to heat the bar 15 to a selected temperature, which is preferably greater than room temperature. The temperature to which the bar 15 is heated by the heating element 27 for the design spacing of the chip sites 11 is selected so that the bar 15 can be cooled to a temperature, which preferably is greater than room temperature but if needed could be cooled to lower than room temperature, at which it can be sufficiently shrunk to compensate for the maximum shrinkage of the substrate 10.

If the bar 15 is to be expanded, the temperature of the heating element 27 is increased to produce this. If the bar is to be contracted because of a larger shrinkage of the substrate 10 during processing than designed, then a suitable cooling fluid is supplied through a cooling tube 28 within the bar 15.

The cooling fluid must be capable of producing the desired cooling range without freezing or boiling. One suitable example of the cooling fluid is a fluorocarbon sold by ISC Ltd, Avonmouth, Bristol, England as PP 9 and has a range between 160° C. and −70° C. Thus, the selected temperature to which the bar 15 is heated could be 40° C. with a range of 100° C. on each side thereof without freezing or boiling of the cooling fluid. If the temperature range is less than 100° C., then water could be used since it boils at 100° C. and freezes at 0° C. when used as a coolant.

The heater 27 is connected to a source of power 29 through a regulator 30. One suitable example of the regulator 30 is sold under the trade name "Accutrol" as Model 128D by BTU Engineering Company, North Billerica, Massachusetts.

The regulator 30 is connected by leads 31 to a thermocouple 32, which is mounted within the bar 15. The regulator 30 is set so that the heater 27 is heated to the selected temperature at which the probe holders 14 are spaced the design distance from each other. The thermocouple 32 causes the regulator 30 to stop flow of current to the heater 27 when the bar 15 is at the selected temperature and to cause flow of current to the heater 27 when the temperature of the bar 15 decreases below the selected temperature.

Each of the probe holders 14 has a plurality of probes 33 (see FIGS. 2 and 4) mounted in its surface 34, which is on the opposite side of the rectangular shaped portion 22 from the V-shaped portion 21. The probes 33 are arranged on each of the probe holders 14 in accordance with the arrangement of the pads 12 on the chip site 11 with which the particular probe holder 14 is to have the probes 33 cooperate. One suitable example of the probes 33 is shown in U.S. Pat. No. 3,806,801 to Ronald O. Bove. Any other suitable probe could be employed.

After processing of the substrate 10 has been completed and testing of the chip sites 11 is to occur, the change of the overall length of the substrate 10 from its design length is obtained. Since the deviation from the design shrinkage of the substrate 10 is substantially uniform between the chip sites 11, the percent of change for the overall dimension of the substrate 10 in the direction of the chip sites 11 is substantially the same percent of change for the distances between the adjacent chip sites 11.

With this variation being ascertained, the temperature of the bar 15 is adjusted. If the overall dimension of the substrate 10 is smaller than its design dimension, then the temperature of the bar 15 would be lowered by supplying the cooling fluid through the cooling tube 28 to cause a shrinkage of the bar 15 to move the probe holders 14 closer to each other. The regulator 30 also would be adjusted to change the heat supplied to the bar 15 by the heater 27 so that the bar 15 would be at the new selected temperature, which is the temperature to maintain the length of the bar 15 so that the spacing between the probe holders 14 is the same as the spacing between the chip sites 11 on the substrate 10 to be tested. Similarly, if the overall length of the substrate 10 is beyond the design length, then the temperature of the bar 15 would be increased by the regulator 30 being adjusted to allow supply of additional heat to the bar 15 from the heater 27 to obtain the necessary expansion of the distances between the adjacent probe holders 14.

If the variation in shrinkage of the substrate 10 should be ± 0.3%, for example, and the distance between the centers of the chip sites 11 at the extreme ends of a row should be 2000 mils, for example, then the maximum variation of the overall length from the design length would be approximately ± 6 mils. If the bar 15 is formed of bronze, which has a coefficient of expansion of $30 \times 10^{-6}/°$ C., a temperature change of 100° C. would produce a change of 6 mils between the centers of the probe holders 14 on opposite ends of the bar 15 since they would be spaced 2000 mils from each other.

Thus, if the length of the substrate 10 should be 0.3% larger than its design length after processing, then heating the bar 100° C. beyond the temperature at which it is set for the design spacing between the probe holders 14 would produce the necessary expansion of the distances between the probe holders 14. Similarly, if the length of the substrate 10 should be 0.3% less than its design length after processing, then a reduction of 100° C. in the temperature of the bar 15 would contract the distances between the probe holders 14 the desired amount so that they would remain aligned with the chip sites 11. The regulator 30 sets the temperature of the bar 15 so that the bar 15 can have the necessary temperature increases and decreases including less than room temperature at its minimum temperature.

While the present invention has described the bar 15 as being formed of bronze or brass, it should be understood that any other suitable material having suitable thermal conductivity and a coefficient of expansion with which slight changes in temperature can produce substantial changes in length could be employed. Thus, aluminum, which has a coefficient of expansion of $25 \times$ $10^{-6}/°$ C., or zinc, which has a coefficient of expansion of $35 \times 10^{-6}/°$ C., could be utilized. It should be understood that a higher coefficient of expansion enables a lower quantity of heat to be required to produce the desired change in the length of the bar 15.

While the present invention has shown and described the bar 15 as being the support for the probe holders 14, it should be understood that a plate, for example, could be employed, if desired, with the probe holders 14 for all of the rows of the chip sites 11 being supported thereon. The application of heat to the plate would cause it to expand substantially uniformly along both its length and width to insure the desired relationship of the probe holders 14 to each of the rows of the chip sites 11.

While the expansion and contraction of the bar 15 has been described as being made by the utilization of heat, it should be understood that any other suitable means for controlling changes in the distances between the probe holders 14 may be employed. For example, the probe holders 14 could be mounted with pads of a resilient material such as rubber, for example, therebetween. Then, a clamp could be utilized to increase or decrease the spacing between the probe holders 14 connected to each other by the resilient pads. The bar 15 might be formed of nickel, which is a magnetic material, and subjected to a magnetic field to change its length with the intensity of the field determining the change in length of the bar 15. Voltage could be applied to opposite ends of the bar 15 through plates thereon to change the length of the bar 15 if the bar 15 is formed of a suitable material such as barium titanate, for example, that changes its length in response to changes in voltage.

While the present invention has shown and described the probe holders 14 as being utilized with the pads 12 on the chip sites 11 of the substrate 10, it should be understood that the probe holders 14 could be utilized anywhere it is desired to test a device subjected to changes in its design dimensions. Thus, the probe holders 14 would contact terminals in various areas of a device, which would be subjected to changes in its design dimensions during processing.

While the present invention has shown and described the bar 15 being cooled by a cooling fluid flowing through the cooling tube 28, it should be understood that any suitable cooling means could be employed. Thus, air could be blown over or through a hole in the bar 15 to cool the bar 15. The bar 15 also could be cooled by relying on room temperature although this would require a relatively long period of time in comparison with using the cooling tube 28.

An advantage of this invention is that the spacing between a plurality of probe heads on a probe support can have the distances therebetween adjusted in accordance with the spacing between the chip sites of a substrate after processing. Another advantage of this invention is that it eliminates the need for the areas of the pads on the chip sites to be enlarged and still be tested even though there is deviation from the design dimension due to processing variation from substrate to substrate.

While the invention has been particularly shown and described with reference to a preferred embodiment thereof, it will be understood by those skilled in the art that various changes in form and details may be made therein without departing from the spirit and scope of the invention.

What is claimed is:

1. A probe device including:
    support means formed of a material having a known coefficient of expansion;
    said support means having a plurality of probe heads mounted thereon;
    each of said probe heads having a plurality of probes arranged thereon in accordance with the arrangement of terminals in an area of a device with which said probes are to cooperate;
    each of said probe heads being a selected distance from each of the adjacent of said probe heads in accordance with the design spacing of the areas on the device;
    and means to change at least one of the length and width dimensions of said support means to change the selected distance of each of said probe heads from the adjacent of said probe heads in accordance with the change in spacing from each other of the areas on the device relative to the design spacing from each other of the areas on the device.

2. The device according to claim 1 in which:
    said support means has a plurality of grooves formed therein;
    each of said probe heads is disposed in one of said grooves in said support means, said grooves being spaced from each other to dispose each of said probe heads the selected distance from each of the adjacent of said probe heads;
    and means to secure each of said probe heads to said support means.

3. The device according to claim 2 in which said dimension changing means comprises means to control the temperature of said support means.

4. The device according to claim 3 in which said control means includes:
    means to apply heat to said support means;
    and means to change the quantity of heat applied from said heat applying means to said support means to change at least the one dimension of said support means in accordance with the change in spacing from each other of the areas on the device relative to their design spacing.

5. The device according to claim 4 in which said support means comprises a longitudinal bar having a single row of said probe heads and having its length changed by said control means.

6. The device according to claim 5 in which said control means includes means to cool said bar when the temperature of said bar is to be reduced.

7. The device according to claim 4 in which said control means includes means to cool said support means when the temperature of said support means is to be reduced.

8. The device according to claim 1 in which said dimension changing means comprises means to control the temperature of said support means.

9. The device according to claim 8 in which said control means includes:
    means to apply heat to said support means;
    and means to change the quantity of heat applied from said heat applying means to said support means to change at least the one dimension of said support means in accordance with the change in the spacing from each other of the areas on the device relative to their design spacing.

10. The device according to claim 9 in which said support means comprises a longitudinal bar having a single row of said probe heads and having its length changed by said control means.

11. The device according to claim 10 in which said control means includes means to cool said bar when the temperature of said bar is to be reduced.

12. The device according to claim 9 in which said control means includes means to cool said support means when the temperature of said support means is to be reduced.

13. A method of adjusting the distance between probe heads in accordance with the spacing of areas on a device to which probes in each of the probe heads are to be applied to terminals in a corresponding one of the areas including:

mounting the probe heads on support means formed of a material having a known coefficient of expansion;

spacing the probe heads on the support means selected distances from each other in accordance with the design spacing of the areas on the device;

ascertaining the change of at least the distance between two adjacent areas of the device from the design distance after processing of the device and before the probes are applied to the terminals in the areas;

and changing the dimension of the support means in the direction in which the probe heads are disposed in accordance with the change of at least the distance between the two adjacent areas of the device from the design distance to alter the spacing of the probe heads on the support means so that the probes on each of the probe heads engage the terminals in the corresponding area.

14. The method according to claim 13 including changing the dimension of the support means by controlling the temperature of the support means.

15. The method according to claim 14 including:
applying heat to the support means to control the temperature of the support means;
and controlling the quantity of heat applied to the support means to change its dimension in accordance with the change of at least the distance between the two adjacent areas of the device to vary the selected distances of the probe heads from each other.

16. The method according to claim 15 including ascertaining the change in the overall dimension of the device relative to the design dimension of the device to ascertain the change in distances between the areas of the device.

17. The method according to claim 16 including cooling the support means when the temperature of the support means is to be reduced.

18. The method according to claim 15 including cooling the support means when the temperature of the support means is to be reduced.

19. The method according to claim 13 including ascertaining the change in the overall dimension of the device relative to the design dimension of the device to ascertain the change in distances between the areas of the device.

* * * * *